(12) United States Patent
Chen et al.

(10) Patent No.: US 7,793,177 B2
(45) Date of Patent: Sep. 7, 2010

(54) CHIP TESTING DEVICE AND SYSTEM

(75) Inventors: Yen-Wen Chen, Taipei County (TW);
Yen-Ynn Chou, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 281 days.

(21) Appl. No.: 11/783,371

(22) Filed: Apr. 9, 2007

(65) Prior Publication Data

US 2008/0086667 A1    Apr. 10, 2008

(30) Foreign Application Priority Data

Oct. 5, 2006    (TW) .............................. 95137100 A

(51) Int. Cl.
*G01R 31/28* (2006.01)

(52) U.S. Cl. .................... 714/724; 714/25; 714/30; 714/42; 714/46; 714/48; 714/703; 714/719; 714/726; 714/727; 714/729; 714/732; 714/734; 714/735; 714/742; 714/818

(58) Field of Classification Search .................... None
See application file for complete search history.

(56) References Cited

U.S. PATENT DOCUMENTS

| | | | | |
|---|---|---|---|---|
| 5,621,740 A | * | 4/1997 | Kamada ..................... | 714/727 |
| 5,656,953 A | * | 8/1997 | Whetsel ..................... | 326/83 |
| 5,721,834 A | * | 2/1998 | Milhaupt et al. ............ | 710/100 |
| 5,732,091 A | * | 3/1998 | Whetsel ..................... | 714/727 |
| 6,199,182 B1 | * | 3/2001 | Whetsel ..................... | 714/724 |
| 6,266,793 B1 | * | 7/2001 | Mozdzen et al. ............ | 714/727 |
| 6,295,621 B1 | * | 9/2001 | Erhart et al. ................ | 714/724 |
| 6,763,487 B2 | * | 7/2004 | Whetsel ..................... | 714/727 |
| 7,231,566 B2 | * | 6/2007 | Whetsel ..................... | 714/726 |
| 2008/0288840 A1 | * | 11/2008 | Whetsel ..................... | 714/727 |

* cited by examiner

*Primary Examiner*—John P Trimmings
(74) *Attorney, Agent, or Firm*—Muncy, Geissler, Olds & Lowe, PLLC

(57) ABSTRACT

A chip testing device having a plurality of testing units is provided. Each testing unit comprises a selector, a flip-flop unit, a first buffer and a second buffer. The selector is controlled by a control signal and has a first input terminal, a feedback input terminal, and a first output terminal. The flip-flop unit has a second input terminal coupled to the first output terminal, a clock signal input terminal for receiving a reference clock signal, and a second output terminal outputting an output data. The first buffer is coupled to the flip-flop unit to convert the output data to a high voltage data, and outputs the high voltage data. The second buffer is coupled to the first buffer to convert high voltage data to low voltage data and transmit the low voltage data to the feedback input terminal.

20 Claims, 4 Drawing Sheets

CHIP TESTING DEVICE AND SYSTEM

BACKGROUND OF THE INVENTION

1. Field of the Invention

The invention relates to a testing device, and more particularly to a testing device using a feedback signal to determine the test result.

2. Description of the Related Art

After a chip is manufactured, the chip undergoes testing to determine whether the chip functions. Complete testing, however, is time consuming, thus, a simplified testing procedure is frequently employed. The simplified test procedure comprises inputting a test signal to the chip and determining whether the output signal via the corresponding pin is correct. FIG. 1 is a block diagram of a conventional chip testing device. The chip testing device 11 comprises a plurality of chip testing units 15, and each chip testing unit comprises a flip-flop unit 12 and an AND gate 13. The flip-flop unit 12 receives an output signal from one pin of a chip, and the output terminal of the flip-flop unit 12 is coupled to a display device 14 and an input terminal of the AND gate 13, wherein another input terminal of the AND gate 13 receives a control signal S1, and the output terminal of the AND gate 13 is coupled to an input terminal of the AND gate of another testing unit, and the output terminal of the last AND gate outputs an output signal S2. When chip testing device 11 operates, the pin of the chip outputs a logic high signal, thus, the output signal of flip-flop unit 12 is also a logic high signal. The output signal of the AND gate 13 is a logic high signal in response to the control signal S1 being a logic high signal. According to the testing mechanism, if the output signal S2 is not at logic high level, there must be at least one pin outputting an incorrect signal. The signal S2, however, is not able to identify faulty pins. The only way to identify faults depends on the state of the display device 14. In one embodiment, the display device 14 is a light emitting diode (LED) or any device that can represent two logic states. In the testing device illustrated in FIG. 1, if the display device 14 does not emit light, this means that the corresponding pin is not outputting a logic high signal. In FIG. 1, the testing device requires a plurality of AND gates, and the size of the circuit area corresponds to the number of pins of the chip. The chip testing mechanism illustrated in FIG. 1 is not actually able to identify the location of the faulty pins, thus, the potential application of the chip testing device is limited.

FIG. 2 is a block diagram of another conventional chip testing device. The chip testing device 11 comprises a plurality of chip testing units 15, each comprising a flip-flop unit, such as the flip-flop unit 12. In FIG. 2, an OR gate 21 coupled to the output terminal of every flip-flop 12 is provided. When the chip testing device 11 operates, the pin of the chip outputs a logic low signal, and the test result can be determined by reading the signal S3. If the signal S3 is at logic high level, there must be at least one pin outputting an incorrect signal, and the location of this pin only can be determined by the display device 14. If the signal S3 is at logic low level, all the pins of the chip are outputting correct signals. In one embodiment, the display device 14 is a light emitting diode (LED) or any device that can represent two logic states. In FIG. 2, the testing unit 18 can select to receive the signal from the output signal of the testing unit 15 or the signal inputted by another input terminal through the multiplexer 17.

Although functional, the conventional chip testing device is limited to testing signals output at only high logic state or low logic state. Moreover, the testing result may not always be correct. For example, if one pin of the chip is coupled to the power source, VDD, the chip testing device illustrated in FIG. 1 cannot test the faulty pin. Thus, a chip testing device capable of more complex processing and advanced testing is needed.

BRIEF SUMMARY OF THE INVENTION

The invention provides a chip testing device and a chip testing system.

An embodiment of a chip testing device of the invention comprises a plurality of testing units. Each testing unit comprises a selector, a flip-flop unit, a first buffer and a second buffer. The selector is controlled by a control signal and has a first input terminal, a feedback input terminal, and a first output terminal. The flip-flop unit has a second input terminal coupled to the first output terminal, a clock signal input terminal for receiving a reference clock signal, and a second output terminal outputting data. The first buffer is coupled to the flip-flop unit to convert the output data to a high voltage data, and outputs the high voltage data. The second buffer is coupled to the first buffer to convert the high voltage data to a low voltage data and transmits the low voltage data to the feedback input terminal.

An embodiment of a chip testing system if the invention comprises a testing device, a chip and a control unit. The testing unit comprises a selector, a flip-flop unit, a first buffer and a second buffer. The selector is controlled by a control signal and has a first input terminal, a feedback input terminal, and a first output terminal. The flip-flop unit has a second input terminal coupled to the first output terminal, a clock signal input terminal for receiving a reference clock signal, and a second output terminal outputting an output data. The first buffer is coupled to the flip-flop unit to convert the output data to a high voltage data, and outputs the high voltage data. The second buffer is coupled to the first buffer to convert the high voltage data to a low voltage data and transmits the low voltage data to the feedback input terminal. The chip has a plurality of pins, wherein a first pin is coupled to the first input terminal of the testing device. The control unit is coupled to the chip controlling the chip to output a test signal via the first pin and determines whether the test signal is the same as the low voltage data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
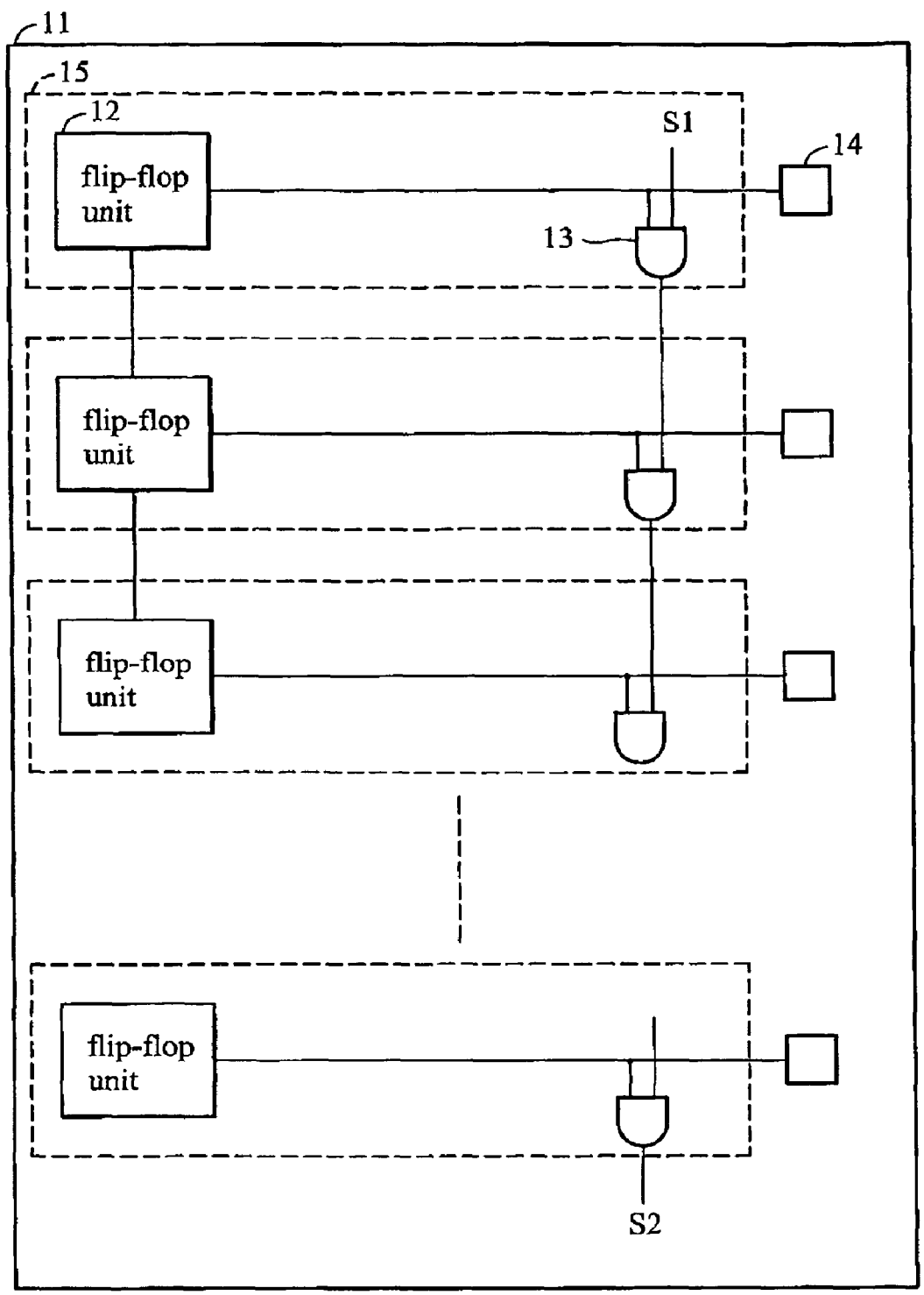
FIG. 1 is a block diagram of a conventional chip testing device.
Figure 2:
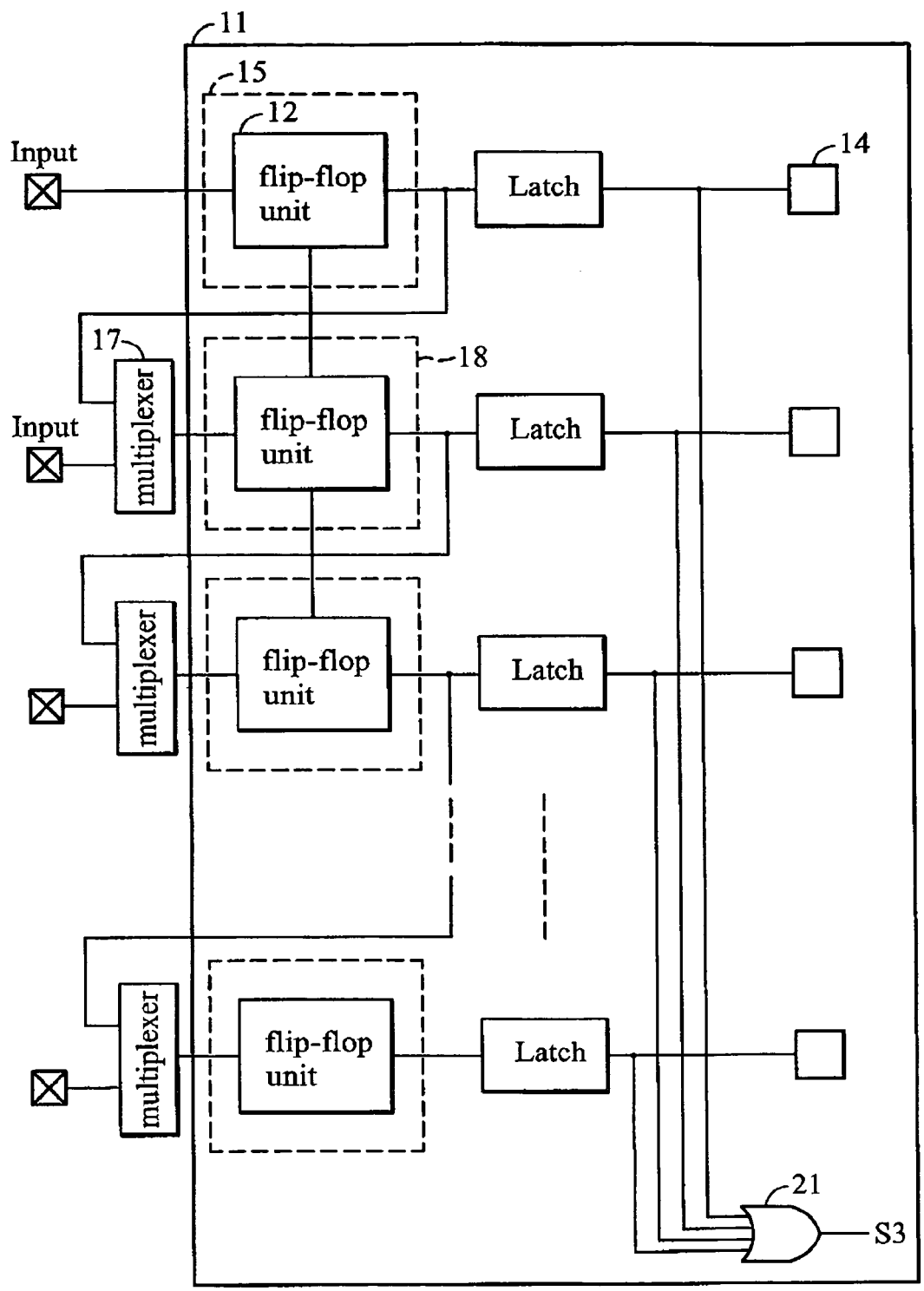
FIG. 2 is a block diagram of another conventional chip testing device.
Figure 3:
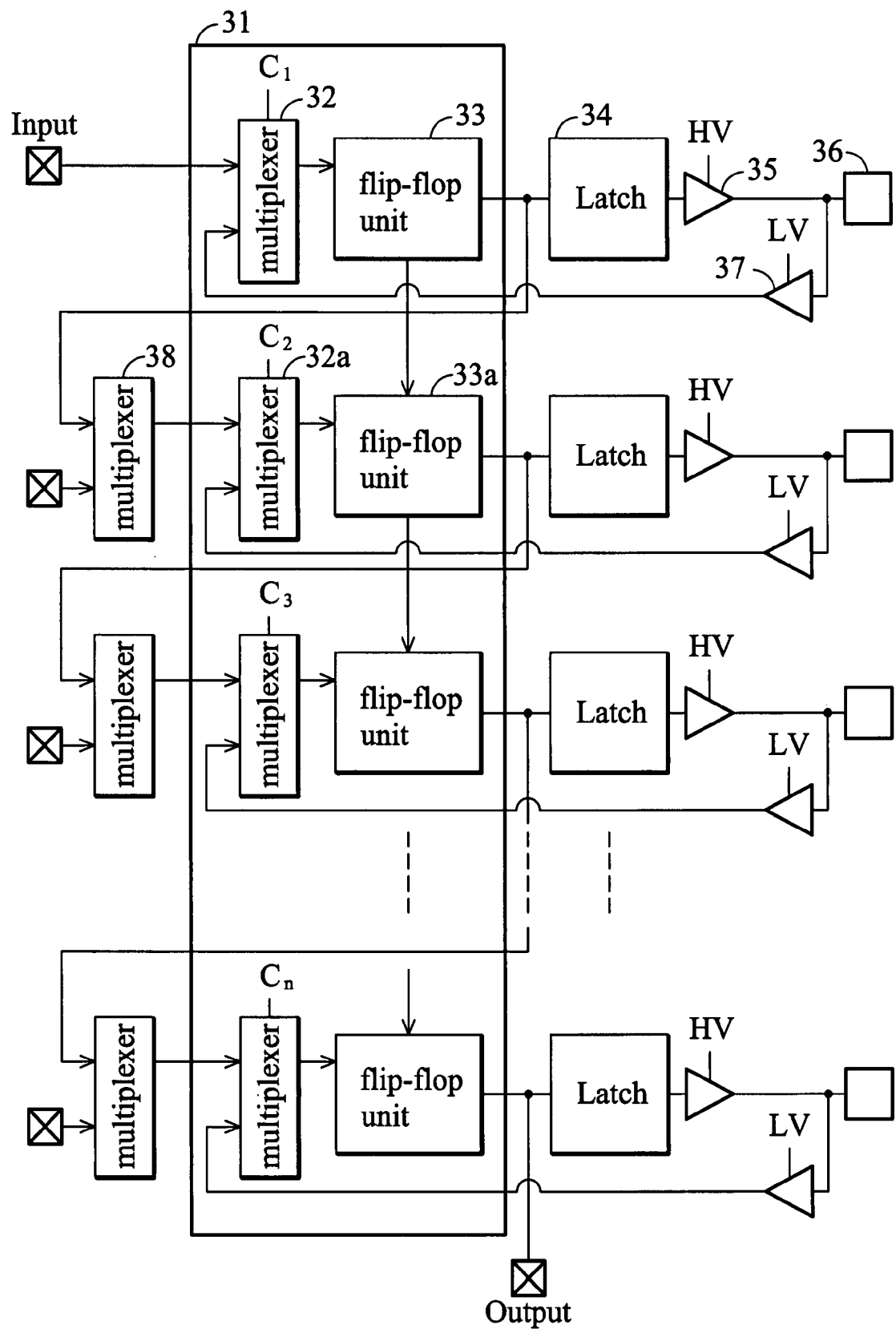
FIG. 3 is a block diagram of an embodiment of a chip testing device.

FIG. 3 is a block diagram of an embodiment of a chip testing device. The chip testing device 31 comprises a plurality of testing units, each comprising a multiplexer and a flip-flop unit. For example, in the device of FIG. 3, the multiplexer 32 has a first input terminal, a feedback input terminal and a first output terminal. The first input terminal receives an output signal from one pin of the chip, and the feedback input terminal receives the output data from the second buffer 37. The control signal $C_1$ controls output of the signal from the first input signal or the signal from the feedback input terminal via the first output terminal. The flip-flop unit 33 receives and outputs the output data from the multiplexer 32 based on a clock signal (not shown in FIG. 3). The latch 34 stores the output data of the flip-flop unit 33. The first buffer 35 pulls up the voltage level of the output data of the latch 34 to drive the display device 36. The second buffer 37 pulls down the voltage level of the output data of the first buffer 35 and transmits the output data of the second buffer 37 to the feedback input terminal of the multiplexer 32.

The control signal $C_1$ controls the multiplexer 32 to output the signal from the feedback input terminal via the first output terminal in response to that the first input terminal of the multiplexer 32 receives and transmits the test signal to the flip-flop unit 33, and the multiplexer 32 reads and compares the feedback data from the flip-flop unit 33 with the test signal to determine whether the testing result is correct. Moreover, the feedback data from the flip-flop unit 33 and the test signal also can be confirmed by the display device 36. In this embodiment, the display device 36 is a light emitting diode (LED). The display device 36 emits light in response when the output data of the first buffer 35 is at a logic high level, and the display device 36 does not emit light in response when the output data of the first buffer 35 is at a logic low level.

In FIG. 3, the flip-flop unit 33a selects the input signal by the multiplexer 32a. The multiplexer 32a receives an external signal and an output signal of a buffer, such as the second buffer 37. The multiplexer 32a selects and outputs the external signal or the output signal of the buffer to the flip-flop unit 33a based on the control signal $C_2$. In this embodiment, the external signal input to the multiplexer 32a is another external signal, such as a test signal, or the output signal of the flip-flop unit 33 via the selecting mechanism of the multiplexer 38.

In this embodiment, the first buffer 35 and the second buffer 37 comprise two cascading inverters, and the flip-flop unit, such as the flip-flop unit is a D flip-flop, a RS flip-flop or a JK flip-flop.

In another embodiment, the test signal is a serial input signal or a parallel input signal. When the test signal is the serial input signal, the test signal is serially input to the flip-flop unit 12 until all the flip-flop units have received the test signal. When the test signal is the parallel input signal, the test signal is simultaneously input to the flip-flop units until all the flip-flop units have received the test signal.

Figure 4:
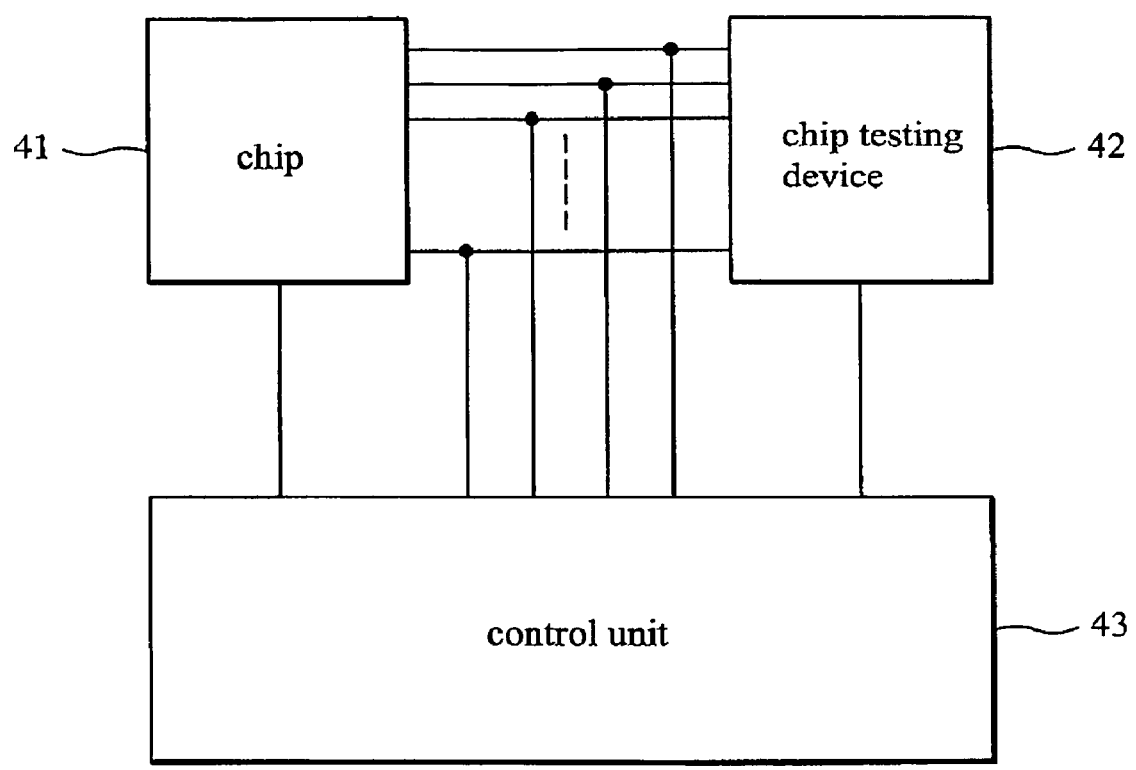
FIG. 4 is a block diagram of an embodiment of a chip testing system.

FIG. 4 is a block diagram of an embodiment of a chip testing system. The chip testing system comprises a chip 41, a chip testing device 42 and a control unit 43. The chip testing device 42 has a plurality of chip testing unit, and each chip testing unit receives an output signal from one pin of the chip 41. FIG. 4 shows a preferred chip testing device 42 as illustrated in FIG. 3. The control unit 43 controls the output signals of the pins of the chip. The chip testing device 42 receives the test signal from the pin of the chip 41 in a first period, and the chip testing device 42 receives its output signal in a second period. The operating mechanism of the chip testing device 42 is similar to the operation between the control signal $C_1$ and multiplexer 32 illustrated in FIG. 3. The control unit 43 receives and compares the testing result from the flip-flop units of all the testing units, such as the flip-flop unit 33 shown in FIG. 3, with the testing signal to determine whether the operation of the chip 41 is correct. According to the operating mechanism shown in FIG. 4, the control unit 43 can control the chip 41 to output a complex test signal, and is not limited to the conventional test mechanism that can only test output signals of the chip at high logic state or low logic state. Thus, the provided chip testing mechanism can significantly increase test accuracy.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip testing device for testing a chip comprising:
    a selector controlled by a control signal, comprising a first input terminal for receiving a test signal from the chip, a feedback input terminal, and a first output terminal;
    a flip-flop unit having a second input terminal coupled to the first output terminal and a second output terminal outputting an output data;
    a first buffer coupled to the flip-flop unit converts the output data to a high voltage data, and outputs the high voltage data; and
    a second buffer coupled to the first buffer to convert the high voltage data to a low voltage data and transmit the low voltage data to the feedback input terminal,
    wherein the selector allows comparing of the low voltage data with an expected test signal to determine whether a testing result of the chip is correct.

2. The device as claimed in claim 1, further comprising a latch coupled between the flip-flop unit and the first buffer to store the output data.

3. The device as claimed in claim 1, wherein the control signal controls the first output terminal to output the signal from the first input signal or the signal from the feedback input terminal.

4. The device as claimed in claim 1, wherein each of the first buffer and the second buffer comprises two inverters.

5. The device as claimed in claim 1, wherein the flip-flop unit is a D flip-flop.

6. The device as claimed in claim 1, wherein the flip-flop unit is an RS flip-flop.

7. The device as claimed in claim 1, wherein the flip-flop unit is a JK flip-flop.

8. The device as claimed in claim 1, further comprising a display device coupled to the first buffer to show the high voltage data.

9. The device as claimed in claim 8, wherein the display device turns on in response to high voltage data at a logic high state, and the display device turns off in response to high voltage data at a logic low state.

10. The device as claimed in claim 1, wherein the first buffer pulls up the voltage level of the output data to generate the high voltage data, and the second buffer pulls down the voltage level of the high voltage data to generate the low voltage data.

11. A chip testing system, comprising:
    a testing device having a plurality of testing units, each comprising:
        a selector controlled by a control signal, having a first input terminal, a feedback input terminal, and a first output terminal;

a flip-flop unit having a second input terminal coupled to the first output terminal and a second output terminal outputting an output data;

a first buffer coupled to the flip-flop unit to convert the output data to a high voltage data, and output the high voltage data; and a second buffer coupled to the first buffer to convert the high voltage data to a low voltage data and transmit the low voltage data to the feedback input terminal;

a chip having a plurality of pins, wherein a first pin is coupled to the first input terminal of the testing device; and a control unit coupled to the chip controlling the chip to output a test signal via the first pin, receiving and comparing the output of the testing device with an expected test signal to determine whether the operation of the chip is correct.

12. The system as claimed in claim 11, wherein the testing device further comprises a latch coupled between the flip-flop unit and the first buffer to store the output data.

13. The system as claimed in claim 11, wherein the control signal controls the first output terminal to output the signal from the first input signal or the signal from the feedback input terminal.

14. The system as claimed in claim 11, wherein the control unit receives and compares the low voltage data and the test signal from the flip-flop unit.

15. The system as claimed in claim 11, wherein each of the first buffer and the second buffer comprises two inverters.

16. The system as claimed in claim 11, further comprising a display device coupled to the first buffer to show the high voltage data.

17. The system as claimed in claim 16, wherein the display device turns on in response to high voltage data at a logic high state, and the display device turns off in response high voltage data at a logic low state.

18. The system as claimed in claim 11, wherein the flip-flop unit is a D flip-flop, an RS flip-flop or a JK flip-flop.

19. The system as claimed in claim 11, wherein the first buffer pulls up the voltage level of the output data to generate the high voltage data, and the second buffer pulls down the voltage level of the high voltage data to generate the low voltage data.

20. The system as claimed in claim 11, wherein the test signal is serially input to the flip-flop units of the testing units until all the flip-flop units have received the test signal when the test signal is a serial input signal, and the test signal is simultaneously input to the flip-flop units of the testing units until all the flip-flop units have received the test signal when the test signal is a parallel input signal.

* * * * *